US012679720B2

(12) United States Patent
Rong et al.

(10) Patent No.: US 12,679,720 B2
(45) Date of Patent: Jul. 14, 2026

(54) MICRO-ELECTROMECHANICAL SYSTEM (MEMS) STRUCTURE AND MEMS MICROPHONE COMPRISING SAME

(71) Applicant: MEMSENSING MICROSYSTEMS (SUZHOU, CHINA) CO., LTD., Suzhou (CN)

(72) Inventors: Genlan Rong, Suzhou (CN); Kai Sun, Suzhou (CN); Yanzi Meng, Suzhou (CN); Wei Hu, Suzhou (CN)

(73) Assignee: MEMSENSING MICROSYSTEMS (SUZHOU, CHINA) CO., LTD., Suzhou (CN)

( * ) Notice: Subject to any disclaimer, the term of this patent is extended or adjusted under 35 U.S.C. 154(b) by 145 days.

(21) Appl. No.: 18/701,569

(22) PCT Filed: Oct. 13, 2022

(86) PCT No.: PCT/CN2022/125097
§ 371 (c)(1),
(2) Date: Apr. 15, 2024

(87) PCT Pub. No.: WO2023/061444
PCT Pub. Date: Apr. 20, 2023

(65) Prior Publication Data
US 2025/0059024 A1 Feb. 20, 2025

(30) Foreign Application Priority Data

Oct. 15, 2021 (CN) .......................... 202122493606.1

(51) Int. Cl.
*B81B 7/00* (2006.01)
*H04R 19/00* (2006.01)
*H04R 19/04* (2006.01)

(52) U.S. Cl.
CPC ......... *B81B 7/0022* (2013.01); *H04R 19/005* (2013.01); *H04R 19/04* (2013.01);
(Continued)

(58) Field of Classification Search
CPC ............... B81B 3/0078; B81B 3/0021; B81B 2201/0264; B81B 2203/0127;
(Continued)

(56) References Cited

U.S. PATENT DOCUMENTS 6,535,460 B2 * 3/2003 Loeppert ............... B81B 3/0072
367/181
2013/0223023 A1 8/2013 Dehe
(Continued)

FOREIGN PATENT DOCUMENTS

CN 107835477 A 3/2018
CN 108584863 A 9/2018
(Continued)

OTHER PUBLICATIONS

International Search Report in International application No. PCT/CN2022/125097, mailed on Jan. 12, 2023.
(Continued)

*Primary Examiner* — Carolyn R Edwards
*Assistant Examiner* — Julie X Dang
(74) *Attorney, Agent, or Firm* — PV IP PC; Wei Te Chung

(57) ABSTRACT

Disclosed are a micro-electromechanical system (MEMS) structure and an MEMS microphone comprising same. The MEMS structure comprises a back plate; and a diaphragm located on one side of the back plate, wherein the diaphragm and the back plate forms a variable capacitor, the diaphragm comprises multiple first through holes and air release structures respectively corresponding to the first through holes,
(Continued)

and the diaphragm further comprises one or more second through holes penetrating through the diaphragm.

19 Claims, 9 Drawing Sheets

(52) U.S. Cl.
CPC .................. *B81B 2201/0257* (2013.01); *B81B 2203/0127* (2013.01); *B81B 2203/0315* (2013.01); *B81B 2203/0338* (2013.01); *B81B 2203/0353* (2013.01); *B81B 2203/0361* (2013.01); *H04R 2201/003* (2013.01)

(58) Field of Classification Search
CPC ..... B81B 2201/0257; B81B 7/02; B81B 3/00; H04R 7/02; H04R 19/005; H04R 23/006; H04R 7/08; H04R 31/00; H04R 19/04; H04R 2201/003; H04R 2410/03; H04R 3/005; H04R 7/04; H04R 7/16; H04R 1/34; H04R 7/26; H04R 1/04; H04R 31/003; H04R 7/18; H04R 2207/021; B81C 1/00158; B81C 1/00182; H10D 48/50
See application file for complete search history.

(56) References Cited

U.S. PATENT DOCUMENTS

2014/0084396 A1* 3/2014 Jenkins ................ H04R 23/006
257/419

| | | | | |
|---|---|---|---|---|
| 2017/0238107 | A1* | 8/2017 | Walther ................. G01K 7/028 438/53 |
| 2019/0023562 | A1* | 1/2019 | Fueldner ............. B81C 1/00182 |
| 2020/0077202 | A1* | 3/2020 | Kamijima .............. H04R 19/04 |
| 2020/0100034 | A1* | 3/2020 | Zhang ....................... H04R 1/04 |
| 2020/0102209 | A1* | 4/2020 | Lin ...................... B81C 1/00531 |
| 2020/0107130 | A1* | 4/2020 | Cheng .................. H04R 31/003 |
| 2020/0245077 | A1* | 7/2020 | Loeppert .............. B81B 3/0051 |
| 2020/0290864 | A1 | 9/2020 | Fueldner |
| 2020/0382876 | A1* | 12/2020 | Cerini ................... H04R 17/02 |
| 2020/0389721 | A1* | 12/2020 | Naderyan ............. B81B 3/0021 |
| 2021/0067882 | A1* | 3/2021 | Rombach .............. H04R 3/005 |
| 2021/0331914 | A1* | 10/2021 | Leidl ...................... B81B 3/007 |

FOREIGN PATENT DOCUMENTS

| | | |
|---|---|---|
| CN | 212435925 U | 1/2021 |
| CN | 213754954 U | 7/2021 |
| CN | 213991017 U | 8/2021 |
| CN | 215935099 U | 3/2022 |
| JP | 2006352785 A | 12/2006 |
| WO | 2014045040 A1 | 3/2014 |

OTHER PUBLICATIONS

Written Opinion of the International Search Authority in International application No. PCT/CN2022/125097, mailed on Jan. 12, 2023.
European Office Action issued in corresponding European Patent Application No. 22880380.5 dated Sep. 16, 2025, pp. 1-28.

* cited by examiner

MICRO-ELECTROMECHANICAL SYSTEM (MEMS) STRUCTURE AND MEMS MICROPHONE COMPRISING SAME

This application is a US national phase application based upon an International Application No. PCT/CN2022/125097, filed on Oct. 13, 2022, which claims priority to Chinese Patent Application No. 202122493606.1, filed with the Chinese Patent Office on Oct. 15, 2021, and entitled "MICRO-ELECTROMECHANICAL SYSTEM (MEMS) STRUCTURE AND MEMS MICROPHONE COMPRISING SAME". The entire disclosures of the above application are incorporated herein by reference.

TECHNICAL FIELD

This application pertains to the technical field of semiconductor device manufacturing, and more specifically, to a micro-electromechanical system structure and MEMS microphone comprising same.

BACKGROUND

In order to improve the electrostatic discharge (ESD) reliability of products, traditional microphone structures are usually improved from a packaging perspective, such as changing the discharge path during the ESD process by embedding capacitance and resistance on the printed circuit board (PCB), which may increase a lot of costs to a certain extent. In addition, traditional microphone structures may also be improved from a MEMS perspective by setting a porous air release structure on the diaphragm, for example, the utility model patent with application No. 202021770513.8 disclosed a movable structure separated from the diaphragm, the movable structure is located in the through hole on the diaphragm and is configured to air release, but the traditional microphone structure may result in poor low frequency response of the product. In order to improve the frequency response performance, it is common to change the through hole on the diaphragm to an air release groove structure, which usually leads to the reliability failure of ESD. This is because during the ESD discharge process, air ionization may produce an explosion, and the airflow mainly acts on the middle area of the diaphragm through the sound hole. Due to the lack of an air release channel in the central area for timely venting, the diaphragm may break and fail.

This application provides a micro-electromechanical system structure and MEMS microphone comprising same, which is an improvement on the utility model patent with application No. 202021770513.8.

SUMMARY

This application provides a micro-electromechanical system structure and an MEMS microphone comprising same, by forming a second through hole in the center area of the diaphragm, atmospheric pressure can quickly leak through the second through hole during ESD discharge, thereby achieving the goal of improving ESD reliability.

A micro-electromechanical system structure, wherein the micro-electromechanical system structure comprises:

a back plate;

a diaphragm, the diaphragm is located on one side of the back plate, wherein the diaphragm and the back plate form a variable capacitor, the diaphragm comprises a plurality of first through holes and one or more air release structures corresponding to the first through holes;

wherein, the diaphragm further comprises one or more second through holes penetrating through the diaphragm.

In some embodiments, the micro-electromechanical system structure further comprises a plurality of connecting pillars, one end of the connecting pillar is fixedly connected to the back plate, and the other end of the connecting pillar is connected to the air release structure, wherein the air release structure is separated from the diaphragm, and the gap between the air release structure and the first through hole is configured to facilitate gas flow.

In some embodiments, the connecting pillar comprises a supporting pillar and a side part, the side part is set around the supporting pillar, wherein the supporting pillar is set corresponding to one of the air release structures. one end of the supporting pillar is fixedly connected to the back plate, and the other end of the supporting pillar is fixedly connected to the air release structure, one end of the side part is fixedly connected to the air release structure, and the other end of the side part is fixedly connected to the back plate;

wherein the inner surface of the side part is in contact with the outer surface of the corresponding supporting pillar.

In some embodiments, the connecting pillar comprises a bottom part and a side part, the bottom part is fixedly connected to the back plate, the side part is set around the bottom part, and the side part is connected to the bottom part, the bottom part and the side part form a cavity.

In some embodiments, a plurality of sound inlet holes are set on the back plate, the sound inlet hole is set corresponding to the first through hole;

the projection of the first through hole partly overlaps with the projection of the corresponding sound inlet hole on a plane perpendicular to the thickness direction of the diaphragm.

In some embodiments, the first through hole is shaped as a polygon, the projection of one part of the ring-shaped edge area of the polygon overlaps with the projection of the back plate on a plane perpendicular to the thickness direction of the diaphragm, the projection of the other part of the edge area overlaps with the projection of the sound inlet hole.

In some embodiments, the shape of the air release structure comprises cylinder or prism, the shape of the air release structure matches with the shape of the first through hole.

In some embodiments, the air release structure comprises at least one groove and/or at least one air release groove, the at least one groove extends radially inward from the cylindrical surface of the air release structure, and the at least one groove penetrates through the top surface and the bottom surface of the air release structure;

the at least one air release groove penetrates through the top surface and the bottom surface of the air release structure.

In some embodiments, the micro-electromechanical system structure further comprises:

a substrate, the substrate comprises a back cavity penetrating through the substrate;

a first supporting structure, the first supporting structure is located between the diaphragm and the substrate;

a second supporting structure, the second supporting structure is located between the back plate and the diaphragm.

In some embodiments, the micro-electromechanical system structure further comprises:

a substrate, the substrate comprises a back cavity penetrating through the substrate;

a first supporting structure, the first supporting structure is located between the back plate and the substrate;

a second supporting structure, the second supporting structure is located between the diaphragm and the back plate.

In some embodiments, the back plate comprises a first back plate and a second back plate, the diaphragm is located between the first back plate and the second back plate.

In some embodiments, the micro-electromechanical system structure further comprises:

a substrate, the substrate comprises a back cavity penetrating through the substrate;

a third supporting structure, the third supporting structure is located between the substrate and the second back plate;

a first supporting structure, the first supporting structure is located between the diaphragm and the second back plate;

a second supporting structure, the second supporting structure is located between the first back plate and the diaphragm.

In some embodiments, the first back plate and the second back plate respectively comprises sound inlet holes.

In some embodiments, the diaphragm comprises a first diaphragm and a second diaphragm, the back plate is located between the first diaphragm and the second diaphragm.

In some embodiments, the micro-electromechanical system structure further comprises:

a substrate, the substrate comprises a back cavity penetrating through the substrate;

a third supporting structure, the third supporting structure is located between the substrate and the first diaphragm;

a first supporting structure, the first supporting structure is located between the first diaphragm and the back plate;

a second supporting structure, the second supporting structure is located between the back plate and the second diaphragm.

In some embodiments, the second through hole is distributed within a circular area, the center of the circular area is the center of the diaphragm, and the radius of the circular area is half the distance from the center to the edge of the diaphragm.

In some embodiments, the shape of the first through hole and the shape of the second through hole are both circle or polygon.

In some embodiments, the first through hole is located in the surrounding area of the diaphragm.

A MEMS microphone, comprises the micro-electromechanical system structure above.

So the micro-electromechanical system structure and the MEMS microphone comprising same provided by the present application can release a large amount of air through the second through hole, and can further improve the gas release ability of the diaphragm and the back plate under high external sound pressure by using the air release structure and the first through hole. Thus, it enhances the ESD reliability of the micro-electromechanical system structure and reduces costs for mass production purposes.

According to various embodiments, the micro-electromechanical system structure and the MEMS microphone comprising same provided by the present application can release a large amount of air through the second through hole, and can further improve the gas release ability of the diaphragm and the back plate under high external sound pressure by using the air release structure and the first through hole. Thus, it enhances the ESD reliability of the micro-electromechanical system structure and reduces costs for mass production purposes.

BRIEF DESCRIPTION OF THE DRAWINGS

FIG. 1b is an enlarged schematic diagram of the connecting pillar in FIG. 1a;

DETAILED WAYS

This application provides a micro-electromechanical system structure and an MEMS microphone comprising same. In order to make the purpose, technical solution, and effect of this application clearer, the following is a detailed explanation of this application with reference to the attached drawings and examples of implementation. It should be understood that the specific embodiments described here are only intended to explain the present application and are not intended to limit the present application.

Embodiment One

Figure 1A:
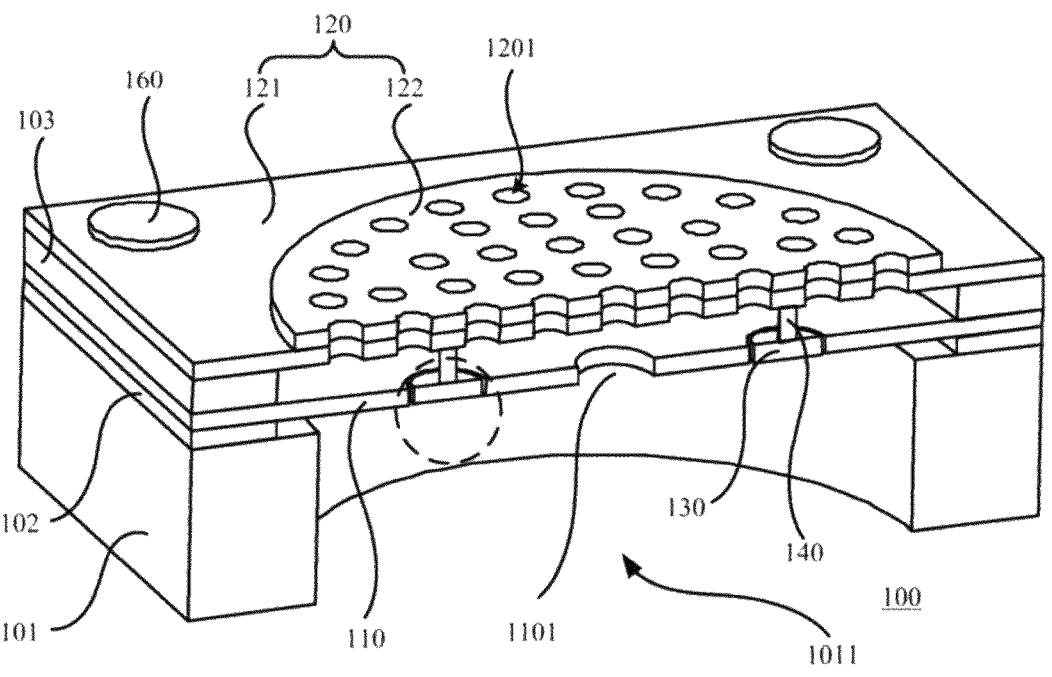
FIG. 1a is a partial stereogram of the micro-electromechanical system structure, which comprises the connecting pillar with the first method in the first embodiment of the present application.
Figure 1B:
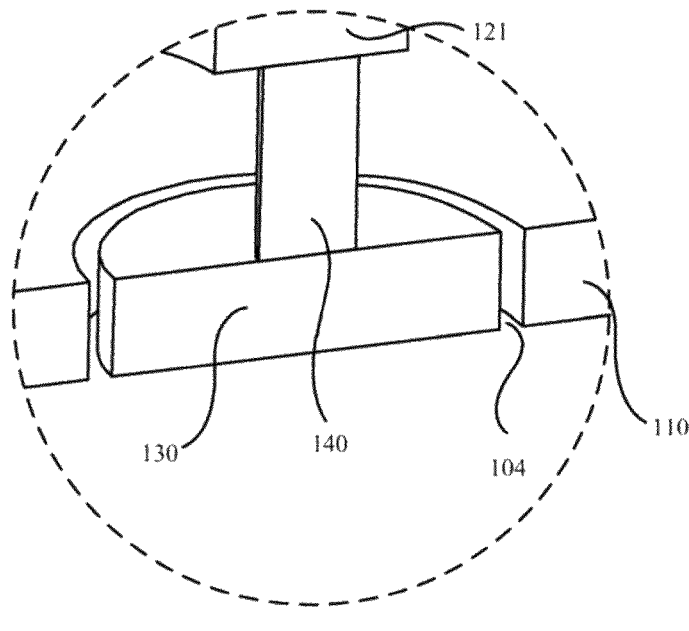

FIG. 1a shows a partial stereogram of the micro-electromechanical system structure in the first embodiment of the present application, FIG. 1b shows an enlarged schematic diagram of the local structure of the connecting pillar 140 in the first method shown in FIG. 1b.

As shown in FIG. 1a and FIG. 1b, micro-electromechanical system structure 100 in the first embodiment of the present application comprises the diaphragm 110, the first back plate 120, the air release structure 130 and the connecting pillar 140. The diaphragm 110 comprises a plurality of air release channels 1101, the diaphragm 110 and the first back plate 120 form a variable capacitor. Wherein the air release channel 1101 comprises the second through hole located at the center of the diaphragm 110 and the first through hole located around the diaphragm 110, the number of the second through hole is one or more, the number of the first through hole is one or more, the number of the air release structure 130 is one or more, each air release structure 130 is located in the corresponding first through hole to separate from the diaphragm 110, wherein the gap between the air release structure 130 and the first through hole is configured to facilitate gas flow.

In this embodiment, the number of the second through hole is one or more, the second through hole is distributed within a circular area, the center of the circular area is the center of the diaphragm 110, and the radius of the circular area is half the distance from the center to the edge of the diaphragm 110, in an example, the cross-sectional shape of the second through hole is circle or polygon. The radius of the circle is 0 to 50 um, and the side length of the polygon is 0 to 50 um. A plurality of second through holes distributed in a circular pattern. The number of the first through hole is one or more, the first through hole is distributed in the surrounding area of the diaphragm 110. Due to the formation of a plurality of first through holes on the diaphragm 110, in order to ensure the reliability of the diaphragm 110, in an example, the thickness of the diaphragm 110 is 0.8 um to 2 um.

The number of the connecting pillar 140 is one or more, one end of the connecting pillar 140 is fixedly connected to the first back plate 120, and the other end of the connecting pillar 140 is fixedly connected to the air release structure 130, in an example, the center of each air release structure 130 is connected to the corresponding connecting pillar 140.

Wherein the material of the diaphragm 110 comprises polycrystalline silicon, and the material of the connecting pillar 140 comprises silicon nitride or silicon oxide, the thickness range of the air release structure 130 comprises 0.3 μm to 3 μm. However, the embodiment of the present application does not limit the material of the diaphragm 110, the material of the connecting pillar 140, and the thickness of the air release structure 130, technicians in the art can make other settings on the material of the diaphragm 110, the material of the connecting pillar 140, and the thickness of the air release structure 130 as needed.

In this embodiment, micro-electromechanical system structure further comprises two solder pads 160, the substrate 101, the first supporting structure 102, and the second supporting structure 103. Each solder pad 160 is located on the first back plate 120, one of solder pads 160 is electrically connected to the first back plate 120, and the other one is electrically connected to the diaphragm 110. The first supporting structure 102 is the portion left on the substrate 101 after the release of the first sacrificial layer, the first supporting structure 102 is located on the peripheral edge of the substrate 101, the diaphragm 110 located above the first supporting structure 102 is supported on the substrate 101 in a fully fixed-peripheral manner.

Wherein the microphone back cavity 1011 is formed between the substrate 101 and the diaphragm 110. the second supporting structure 103 is the portion left on the diaphragm 110 after the release of the second sacrificial layer, the position of the second supporting structure 103 corresponds to the position of the first supporting structure 102, the second supporting structure 103 is located on the peripheral edge of the diaphragm 110, the first back plate 120 located above the second supporting structure 103 is supported on the substrate 101 and the diaphragm 110 in a fully fixed-peripheral manner, so that the portion of the first back plate 120 that is not in contact with the second supporting structure 103 is spaced at a predetermined distance from the diaphragm 110. Wherein the material of the first supporting structure 102 comprises silicon oxide, the material of the second supporting structure 103 comprises silicon oxide. However, the embodiment of the present application does not limit the material of the first supporting structure 102, the material of the second supporting structure 103, and support and fixation method between the substrate 101, the diaphragm 110, and the first back plate 120, technicians in the art can make other settings on the material of the first supporting structure 102, the material of the second supporting structure 103, and support and fixation method between the substrate 101, the diaphragm 110, and the first back plate 120 as needed.

In this embodiment, the first back plate 120 comprises the first lower back plate 121 and the first upper back plate 122, the first lower back plate 121 is fixed on the second supporting structure 103 and connected to the connecting pillar 140, the first upper back plate 122 is located on the first lower back plate 121. Wherein the size of the first upper back plate 122 is smaller than that of the first lower back plate 121, and the first upper back plate 122 corresponds to the portion of the first back plate 120 that is not in contact with the second supporting structure 103. Wherein the material of the first lower back plate 121 is non conductive material, exemplary, can be silicon nitride, the material of the first upper back plate 122 is conductive material, exemplary, can be polysilicon. The first back plate 120 comprises a plurality of first sound inlet holes 1201, each first sound inlet hole 1201 penetrates through the the first lower back plate 121 and the first upper back plate 122, the first sound inlet hole 1201 is configured to allow the sound signals to reach the diaphragm 110 through the sound inlet hole 1201. However, the embodiment of the present application does not limit the structure and the material of the first back plate 120, technicians in the art can make other settings on the structure and the material of the first back plate 120 as needed.

In this embodiment, there are various forms of the connecting pillar 140, exemplary, as shown in FIG. 1a and FIG. 1b, the connecting pillar 140 is a solid pillarar structure.

Figure 1C:
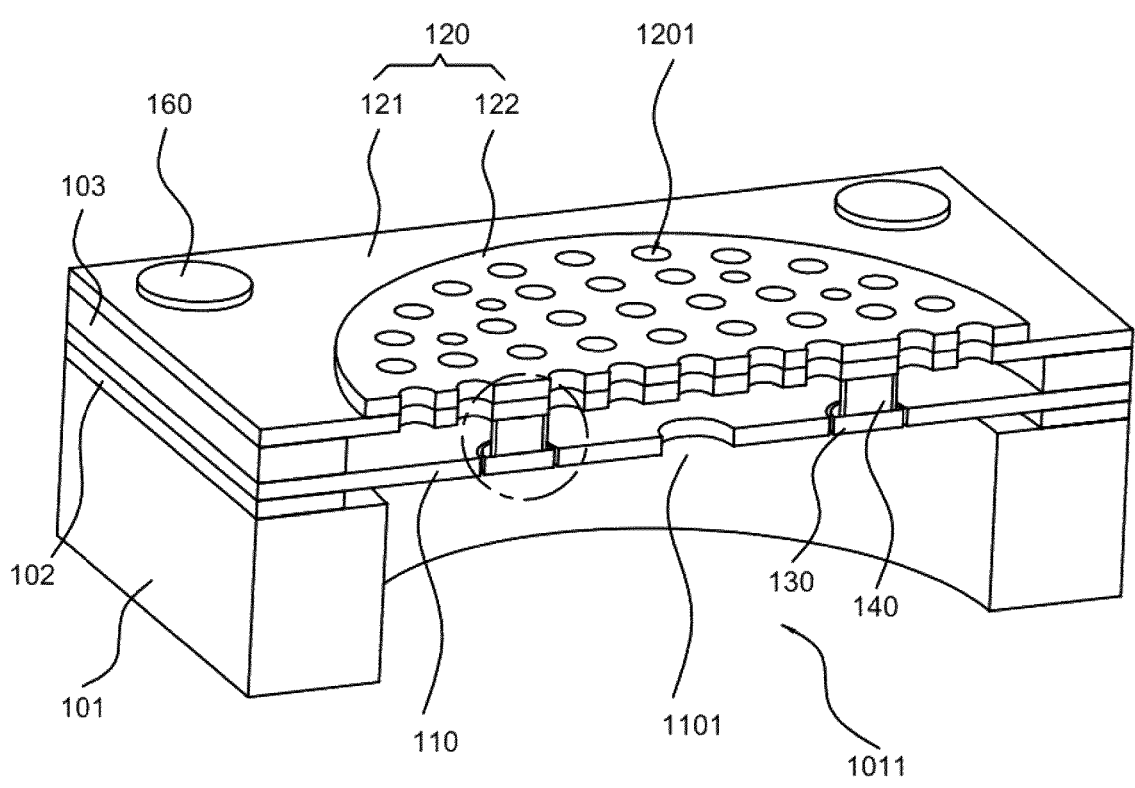
FIG. 1c is a partial stereogram of the micro-electromechanical system structure, which comprises the connecting pillar with the second method in the first embodiment of the present application.
Figure 1D:
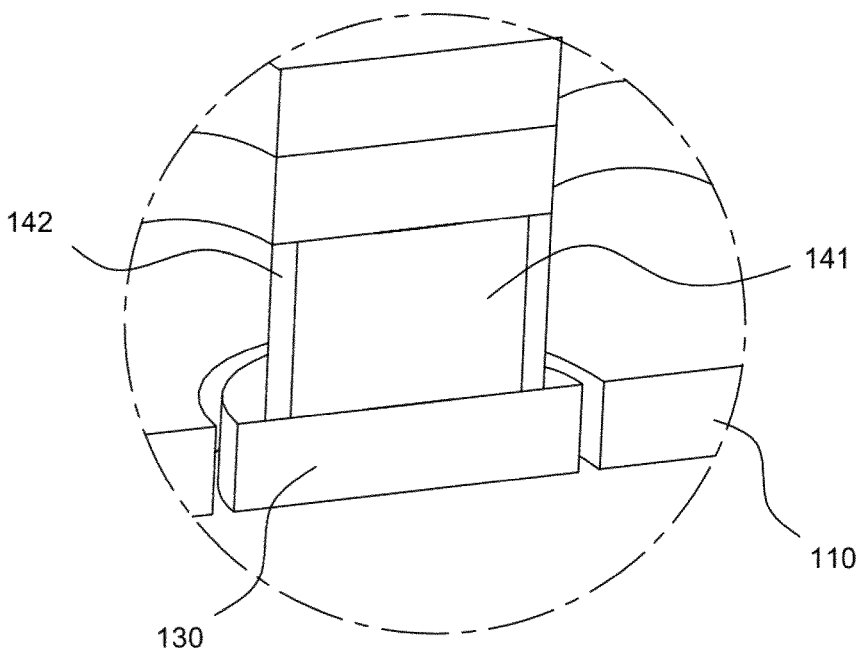
FIG. 1d is an enlarged schematic diagram of the connecting pillar in FIG. 1c.

As shown in FIG. 1c and FIG. 1d, FIG. 1c shows a partial stereogram of the micro-electromechanical system structure which comprises the connecting pillar 140 with the second structure, FIG. 1d shows a partial enlarged schematic diagram of the connecting pillar 140.

The connecting pillar 140 further comprises the supporting pillar 141, wherein each supporting pillar 141 is set corresponding to an air release structure 130. one end of each supporting pillar 141 is fixedly connected to the first back plate 120, and the other end of each supporting pillar 141 is fixedly connected to the air release structure 130; The connecting pillar 140 further comprises the side part 142, one end of the side part 142 is fixedly connected to the air release structure 130, and the other end of the side part 142 is fixedly connected to the first back plate 120, the side part 142 is set around the supporting pillar 141, the inner surface of the side part 142 is in contact with the outer surface of the corresponding supporting pillar 141. Specifically, one end of the supporting pillar 141 is fixedly connected to the first lower back plate 121, and one end of the side part 142 is fixedly connected to the first lower back plate 121.

In this embodiment, the side part 142 is wrapped on the outer surface of the supporting pillar 141, the supporting pillar 141 can support the side part 142, and thereby can increase the strength of the connecting pillar 140 and reduce the probability of failure of the connecting pillar 140. Furthermore, the side part 142, the air release structure 130 and the diaphragm 110 are prepared using the same material, the supporting pillar 141 and the second supporting structure 103 are prepared using the same material.

Figure 1E:
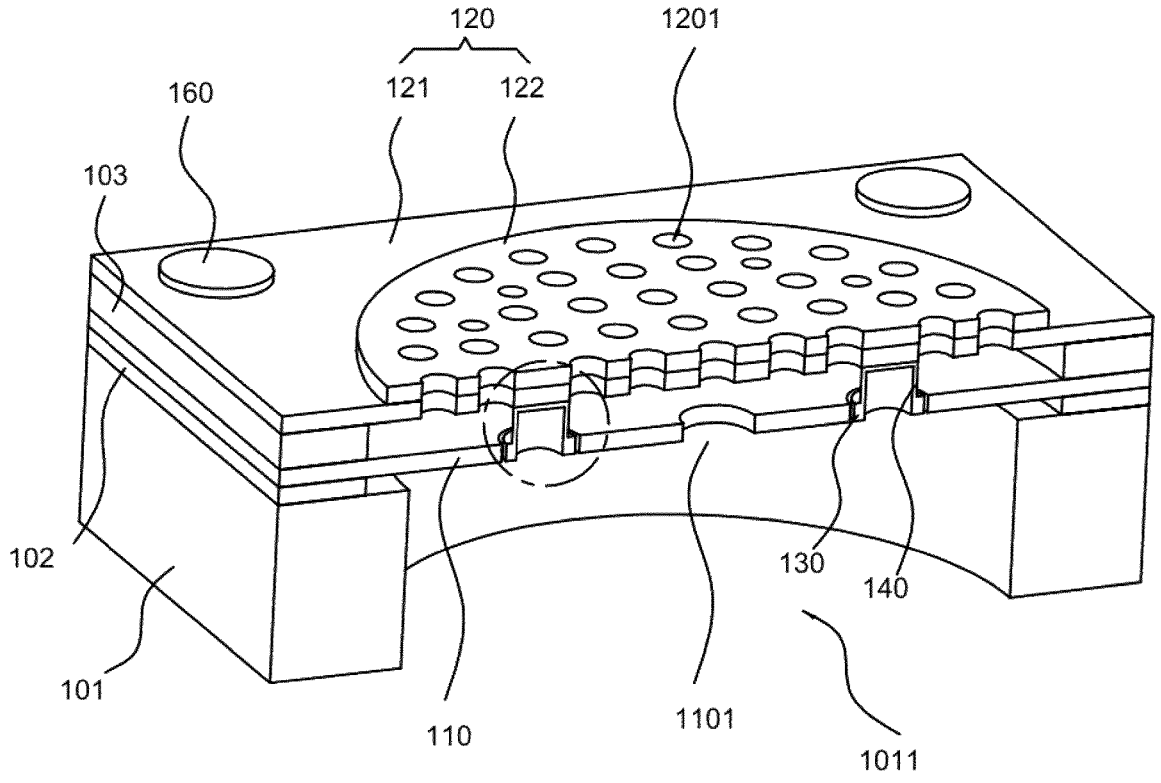
FIG. 1e is a partial stereogram of the micro-electromechanical system structure, which comprises the connecting pillar with the third method in the first embodiment of the present application.
Figure 1F:
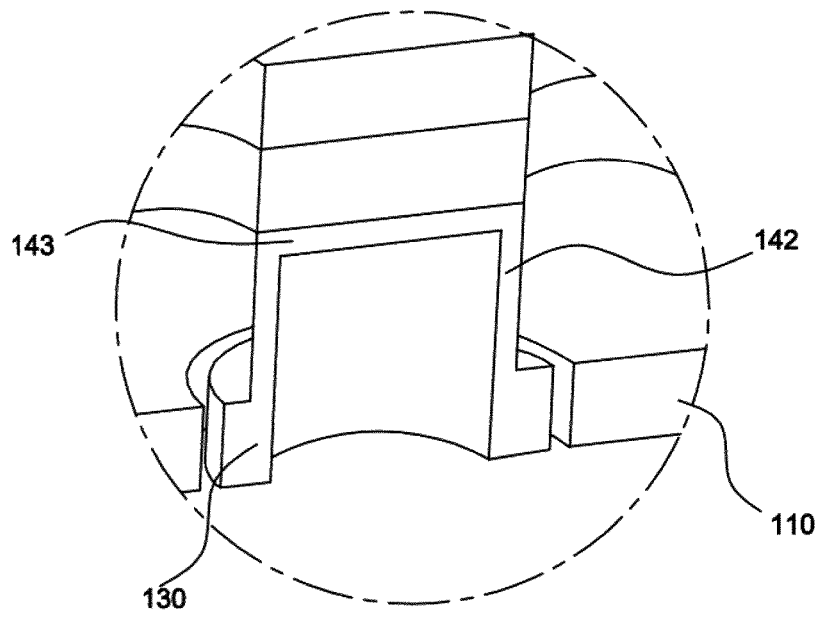
FIG. 1f is an enlarged schematic diagram of the connecting pillar in FIG. 1e.

As shown in FIG. 1*e* and FIG. 1*f*, FIG. 1*e* shows a partial stereogram of the micro-electromechanical system structure, which comprises the connecting pillar 140 with the second method, FIG. 1*f* shows a partial enlarged schematic diagram of the connecting pillar 140. The connecting pillar 140 further comprises the bottom part 143 and the side part 142, the bottom part 143 is fixedly connected to the first back plate 120, the side part 142 is set around the bottom part 143, and the side part 142 is connected to the bottom part 143, the bottom part 143 and the side part 142 form a cavity.

In this embodiment, the connecting pillar 140 further comprises the bottom part 143 and the side part 142, the bottom part 143 is fixedly connected to the first back plate 120, the side part 142 is set around the bottom part 143, and the side part 142 is connected to the bottom part 143, the bottom part 143 and the side part 142 form a cavity, the cavity can reduce the weight of the connecting pillar 140, and thereby can reduce pressure on the first back plate 120, the other side of the cavity is a non enclosed structure, so that when the pressure of the gas entering the microphone component is high, the cavity can share a portion of the pressure to avoid causing significant impact on the diaphragm 110 and resulting in damage to the diaphragm 110. Furthermore, the bottom part 143 and the side part 142 are prepared using the same material. Specifically, one end of the bottom part 143 is fixedly connected to the first lower back plate 121.

In an example, the sound inlet hole 1201 are set on the first back plate 120, each sound inlet hole 1201 is set corresponding to a first through hole.

The projection of the first through hole partly overlaps with the projection of the corresponding sound inlet hole 1201 on a plane perpendicular to the thickness direction of the diaphragm 110.

In an example, the first through hole is shaped as a polygon, the projection of one part of the edge area of the polygon overlaps with the projection of the first back plate 120 on a plane perpendicular to the thickness direction of the diaphragm 110, the projection of the other part of the edge area of the polygon overlaps with the projection of the sound inlet hole 1201.

In this embodiment, when the diaphragm 110 deforms under loud pressure, it undergoes deformation, part of the edge of the first through hole of the diaphragm 110 covers the first back plate 120, and the other part covers the sound inlet hole 1201, compared to the circular regular boundary, when the pressure is high and the deformation area 1012 of the diaphragm 110 undergoes significant deformation, the diaphragm 110 does not fully cover the sound inlet hole 1201, and the sound pressure in the front and rear chambers can still be balanced through the sound inlet hole 1201, thereby can reduce the product failure rate.

Figure 1G:
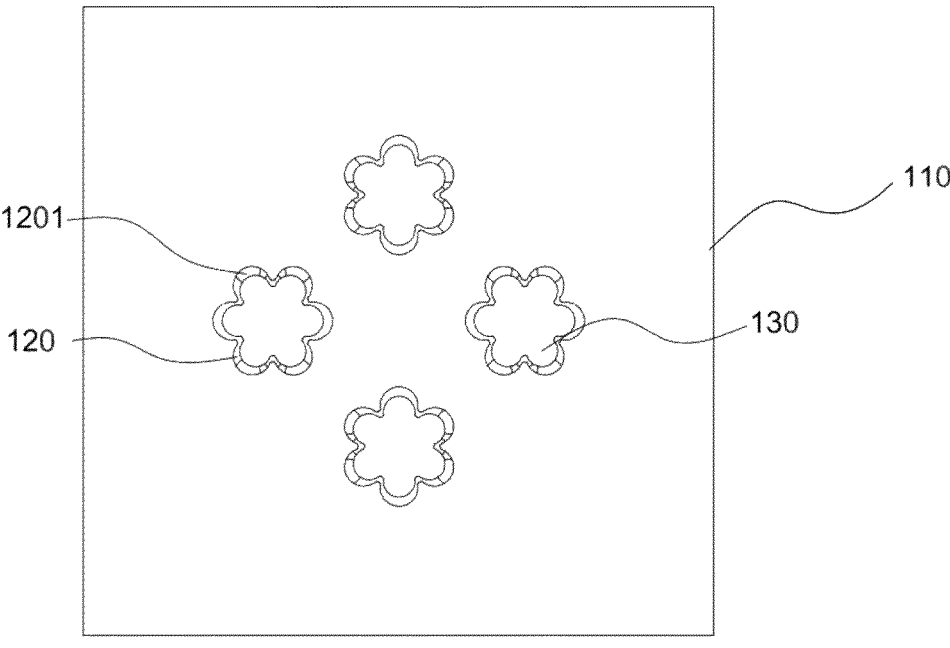
FIG. 1g is a bottom view of the micro-electromechanical system structure after removing the substrate and the first supporting structure, where the micro-electromechanical system structure comprises the first through hole with a polygonal structure in the first embodiment of the present application.

In an example, as shown in FIG. 1*g*, FIG. 1*g* shows a bottom view of the micro-electromechanical system structure which comprises the first through hole with a polygonal structure. The six sides of the first through hole are all curved in shape, on a plane perpendicular to the thickness direction of the diaphragm 110, a part of the curved projection overlaps with the projection of the sound inlet hole 1201, and the other part of the curved projection overlaps with the projection of the first back plate 120.

In an optimal embodiment, the micro-electromechanical system structure further comprises a plurality of raised structures (not shown in FIG. 1*a*), a plurality of raised structures are located on the side of the first back plate 120 toward the diaphragm 110, and are configured to prevent adhesion between the diaphragm 110 and the first back plate 120. The shape of the air release structure 130 comprises cylinder, prism, or fan-shaped cylinder. In an optimal embodiment, the shape of the air release structure 130 matches with the shape of the first through hole, a detailed explanation of the cylindrical air release structure 130 will be provided following based on FIGS. 1*a*, 1*h*, and 1*i*.

The air release structure 130 is a complete cylinder, the radius range of the cylinder comprises 0 μm to 100 μm. The air release structure 130 is located in the first through hole of the diaphragm 110, as shown in FIG. 1*b*, the gap between the air release structure 130 and the first through hole is circular in shape, the gap can be served as an air release channel, and the width range of the gap comprises 0 μm to 5 μm, the circumference range of the circular air release channel comprises 10 μm to 100 μm. In a further example, in the case where the air release structure 130 is a multi prism, the side length range of the multi prism comprises 0 μm to 100 μm. In a further example, in the case where the air release structure 130 is a fan-shaped cylinder, the angle range of the fan-shaped cylinder is 0 degree to 360 degrees.

However, the embodiment of the present application does not limit this, technicians in the art can make other settings on other parameters, such as the size of the air release structure 130 and the width of the gap as needed.

The gap between the air release structure 130 and the first through hole can also be a polygonal groove or arc-shaped groove, for example, the width of the groove is 0 um to 5 um, and the circumference of the groove is 10 um to 100 um.

Figure 1H:
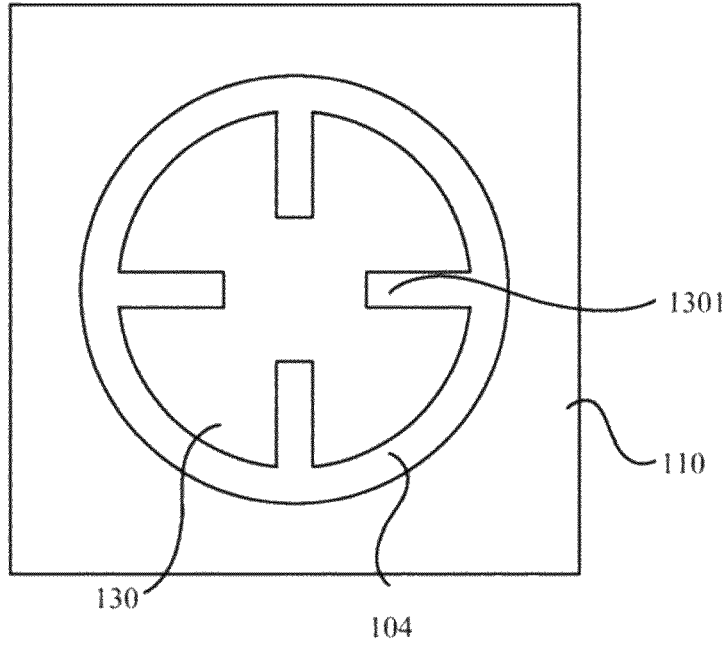
FIG. 1h is a schematic diagram of an air release structure composed of a cylinder and one or more grooves in the first embodiment of the present application.

In a further embodiment, the air release structure 130 can also be composed of a cylinder and one or more grooves 1301, as shown in FIG. 1*h*. The groove 1301 extends radially inward from the cylindrical surface of the air release structure 130, and the groove 1301 penetrates through the top surface and the bottom surface of the air release structure 130.

In an optimal embodiment, the number of the groove 1301 is more, a plurality of openings of grooves 1301 are uniformly distributed along the outer edge of the air release structure 130, when the air release structure 130 is located in the first through hole of the diaphragm 110, the gap between the air release structure 130 and the first through hole is circular in shape, the gap and the groove 1301 can be connected and can be formed a air release channel, the width of the groove 1301 can be consistent with the width of the gap.

Figure 1I:
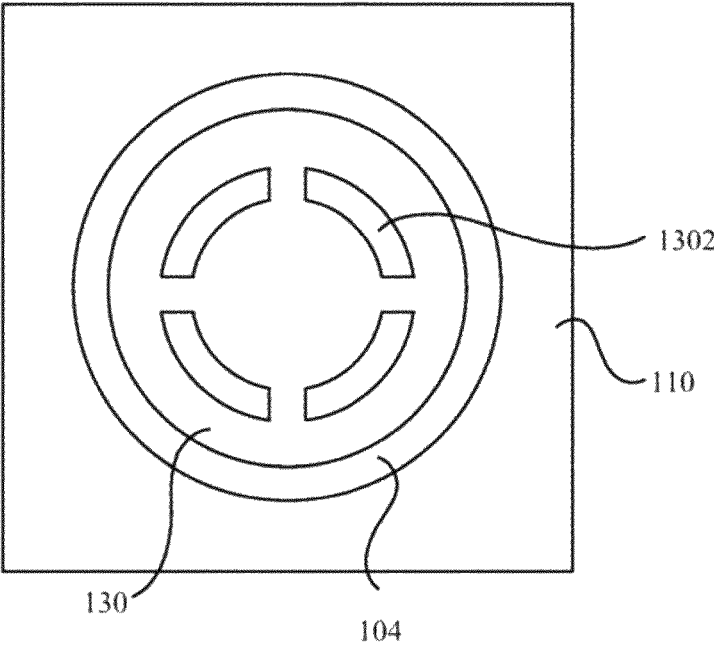
FIG. 1i is a schematic diagram of an air release structure composed of a cylinder and one or more air release grooves in the first embodiment of the present application.

In a further embodiment, the air release structure 130 can also be composed of a cylinder and one or more air release grooves 1302, as shown in FIG. 1*i*. For example, the air release groove 1302 surrounds the center of the air release structure 130 and penetrates through the top surface and the bottom surface of the air release structure 130. Alternatively, the air release structure 130 may also be composed of a cylinder, one or more grooves 1301, and one or more air release grooves 1302.

Embodiment Two

Figure 2:
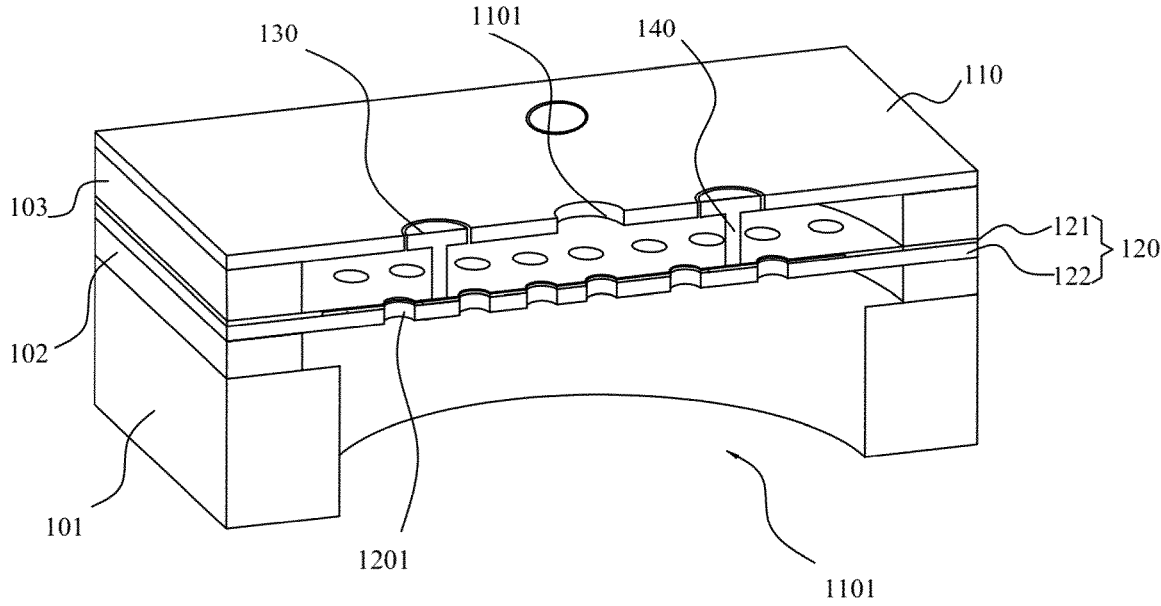
FIG. 2 is a partial stereogram of the micro-electromechanical system structure in the second embodiment of the present application.

FIG. 2 shows a partial stereogram of the micro-electromechanical system structure of the present application. micro-electromechanical system structure 100 comprises the diaphragm 110, the first back plate 120, the air release structure 130, the connecting pillar 140, the solder pad 160, the substrate 101, the first supporting structure 102, the second supporting structure 103, and the raised structure 106. The difference between the micro-electromechanical system structure 100 in the second embodiment and the micro-electromechanical system structure 100 in the first embodiment is that the first supporting structure 102 in the micro-electromechanical system structure 100 of the second embodiment is located between the back plate 120 and the substrate 101, and the second supporting structure 103 is located between the diaphragm 110 and the back plate 120, wherein the microphone back cavity 1011 is formed between the substrate 101 and the back plate 120, the first supporting structure 102 is the portion left on the substrate 101 after the release of the first sacrificial layer, the first supporting structure 102 is located on the peripheral edge of the substrate 101, the back plate 120 located above the first supporting structure 102 is supported on the substrate 101 in a fully fixed-peripheral manner. The second supporting structure 103 is the portion left on the back plate 120 after the release of the second sacrificial layer, the position of the second supporting structure 103 corresponds to the position of the first supporting structure 102, the second supporting structure 103 is located on the peripheral edge of the back plate 120, the diaphragm 110 located above the second supporting structure 103 is supported on the substrate 101 and the back plate 120 in a fully fixed-peripheral manner, so that the portion of the first back plate 120 that is not in contact with the second supporting structure 103 is spaced at a predetermined distance from the diaphragm 110. Wherein the material of the first supporting structure 102 comprises silicon oxide, the material of the second supporting structure 103 comprises silicon oxide. However, the embodiment of the present application does not limit this, technicians in the art can make other settings on the material of the first supporting structure 102, the material of the second supporting structure 103, and support and fixation method between the substrate 101, the diaphragm 110, and the first back plate 120 as needed.

In this embodiment, the first back plate 120 comprises the first lower back plate 121 and the first upper back plate 122, the first upper back plate 122 is fixed on the second supporting structure 103 and connected to the connecting pillar 140, the first upper back plate 122 is located on the first lower back plate 121. Wherein the size of the first upper back plate 122 is smaller than that of the first lower back plate 121, and the first upper back plate 122 corresponds to the portion of the first back plate 120 that is not in contact with the second supporting structure 103. Wherein the material of the first lower back plate 121 comprises silicon nitride, the material of the first upper back plate 122 comprises polysilicon. The first back plate 120 comprises a plurality of first sound inlet holes 1201, each first sound inlet hole 1201 penetrates through the first lower back plate 121 and the first upper back plate 122, the first sound inlet hole 1201 is configured to allow the sound signals to reach the diaphragm 110 through the sound inlet hole 1201. However, the embodiment of the present application does not limit the structure and the material of the first back plate 120, technicians in the art can make other settings on the structure and the material of the first back plate 120 as needed.

As shown in FIG. 1*c*, the connecting pillar 140 further comprises the supporting pillar 141, one end of the supporting pillar 141 is fixedly connected to the first upper back plate 122, one end of the side part 142 is fixedly connected to the first upper back plate 122, each supporting pillar 141 is set corresponding to an air release structure 130, the other end of the supporting pillar 141 is fixedly connected to the first lower back plate 121, the other end of the side part 142 is fixedly connected to the first lower back plate 121, the side part 142 is set around the supporting pillar 141, the inner surface of the side part 142 is in contact with the outer surface of the corresponding supporting pillar 141.

In this embodiment, the side part 142 is wrapped on the outer surface of the supporting pillar 141, the supporting pillar 141 can support the side part 142, and thereby can increase the strength of the connecting pillar 140 and reduce the probability of failure of the connecting pillar 140. Furthermore, the side part 142, the air release structure 130 and the diaphragm 110 are prepared using the same material, the supporting pillar 141 and the second supporting structure 103 are prepared using the same material.

As shown in FIG. 1*e*, the connecting pillar 140 further comprises the bottom part 143 and the side part 142, the bottom part 143 is fixedly connected to the back plate 120, the side part 142 is set around the bottom part 143, and the side part 142 is connected to the bottom part 143, one end of the bottom part 143 is fixedly connected to the first upper back plate 122, the bottom part 143 and the side part 142 form a cavity, the cavity can reduce the weight of the connecting pillar 140, and thereby can reduce pressure on the back plate 120, the other side of the cavity is a non enclosed structure, so that when the pressure of the gas entering the microphone component is high, the cavity can share a portion of the pressure to avoid causing significant impact on the diaphragm 110 and resulting in damage to the diaphragm 110. Furthermore, the bottom part 143 and the side part 142 are prepared using the same material.

In this embodiment, the connecting pillar 140 can be a solid pillarar structure as shown in FIG. 1*a* and FIG. 1*b*, and other technical details can refer to the micro-electromechanical system structure in the first embodiment, which will not be elaborated here.

Embodiment Three

Figure 3:
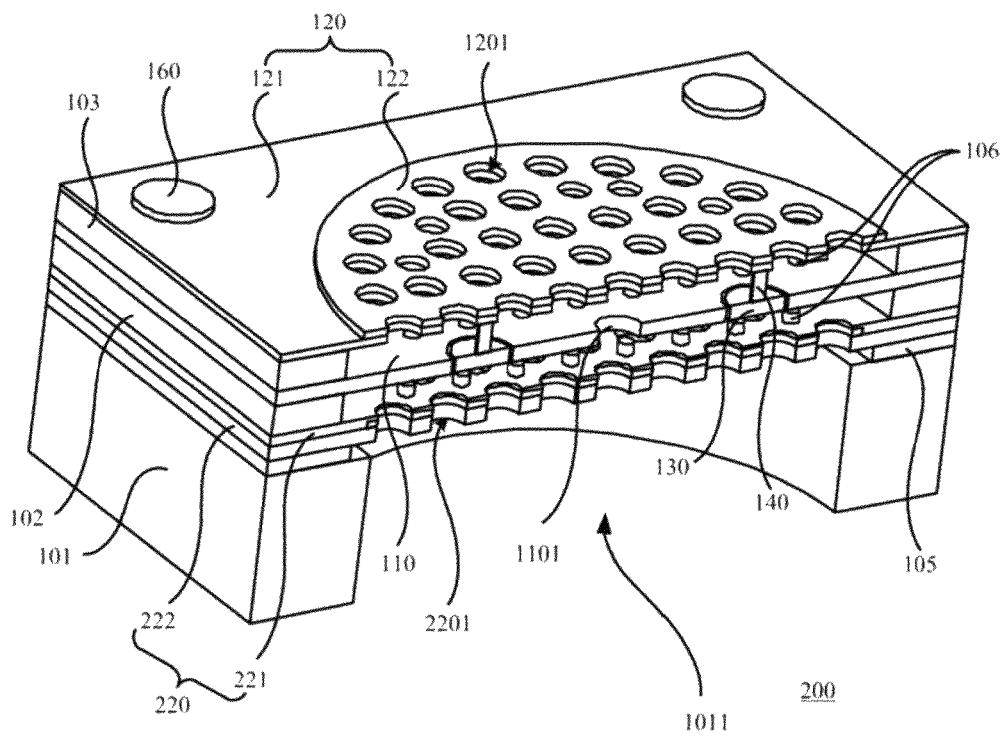
FIG. 3 is a partial stereogram of the micro-electromechanical system structure in the third embodiment of the present application.

FIG. 3 shows a partial stereogram of the micro-electromechanical system structure in the third embodiment of the present application. micro-electromechanical system structure 100 comprises the diaphragm 110, the first back plate 120, the air release structure 130, the connecting pillar 140, the solder pad 160, the substrate 101, the first supporting structure 102, and the second supporting structure 103, in an optional example, micro-electromechanical system structure 100 further comprises the second back plate 220, the third supporting structure 105, and the raised structure 106. The difference between the micro-electromechanical system structure 100 in this embodiment and the micro-electromechanical system structure 100 in the first embodiment is that the micro-electromechanical system structure 100 in the second embodiment is a double back plate structure, here will not repeat the similarities, only describes the differences.

The micro-electromechanical system structure 100 of this embodiment further comprises the second back plate 220 and the third supporting structure 105, the second back plate 220 and the third supporting structure 105 are both located between the first supporting structure 102 and the substrate 101.

The third supporting structure 105 is the portion left on the substrate 101 after the release of the third sacrificial layer, the third supporting structure 105 is located on the peripheral edge of the substrate 101, the second back plate 220 located above the third supporting structure 105 is supported on the substrate 101 in a fully fixed-peripheral manner. The first supporting structure 102 is the portion left on the second back plate 220 after the release of the first sacrificial layer, the first supporting structure 102 is located on the peripheral edge of the second back plate 220, the diaphragm 110 located above the first supporting structure 102 is supported on the second back plate 220 in a fully fixed-peripheral manner, so that the portion of the second back plate 220 that is not in contact with the first supporting structure 102 is spaced at a predetermined distance from the diaphragm 110. The second supporting structure 103 is the portion left on the diaphragm 110 after the release of the second sacrificial layer, the position of the second supporting structure 103 corresponds to the position of the first supporting structure 102, the second supporting structure 103 is located on the peripheral edge of the diaphragm 110, the first back plate 120 located above the second supporting structure 103 is supported on the diaphragm 110 in a fully fixed-peripheral manner, so that the portion of the first back plate 120 that is not in contact with the second supporting structure 103 is spaced at a predetermined distance from the diaphragm 110.

The second back plate 220 comprises the second lower back plate 221 and the second upper back plate 222, the second lower back plate 221 is fixed on the third supporting structure 105, the second upper back plate 222 is located on the second lower back plate 221. Wherein the size of the second upper back plate 222 is equal to that of the second lower back plate 221. Wherein the material of the second lower back plate 221 comprises silicon nitride, the material of the second upper back plate 222 comprises polysilicon. The second back plate 220 comprises a plurality of second sound inlet holes 2201, each second sound inlet hole 2201 penetrates through the second lower back plate 221 and the second upper back plate 222, the second sound inlet hole 2201 is configured to allow the sound signals to reach the diaphragm 110 through the second sound inlet hole 2201. However, the embodiment of the present application does not limit this, technicians in the art can make other settings on the structure and the material of the first back plate 120 as needed.

In this embodiment, the diaphragm 110 is located between the first back plate 120 and the second back plate 220, a plurality of air release channels 1101 are formed in the movable area of the diaphragm 110, wherein the air release channel 1101 comprises the second through hole located at the center of the diaphragm 110 and the first through hole located around the diaphragm 110, the second through hole is configured to rapid air release, and the first through hole is configured to assisting air release, in addition, an air release structure 130 is located in the first through hole, the air release structure 130 is connected to the first back plate 120 through the connecting pillar 140.

Embodiment Four

Figure 4:
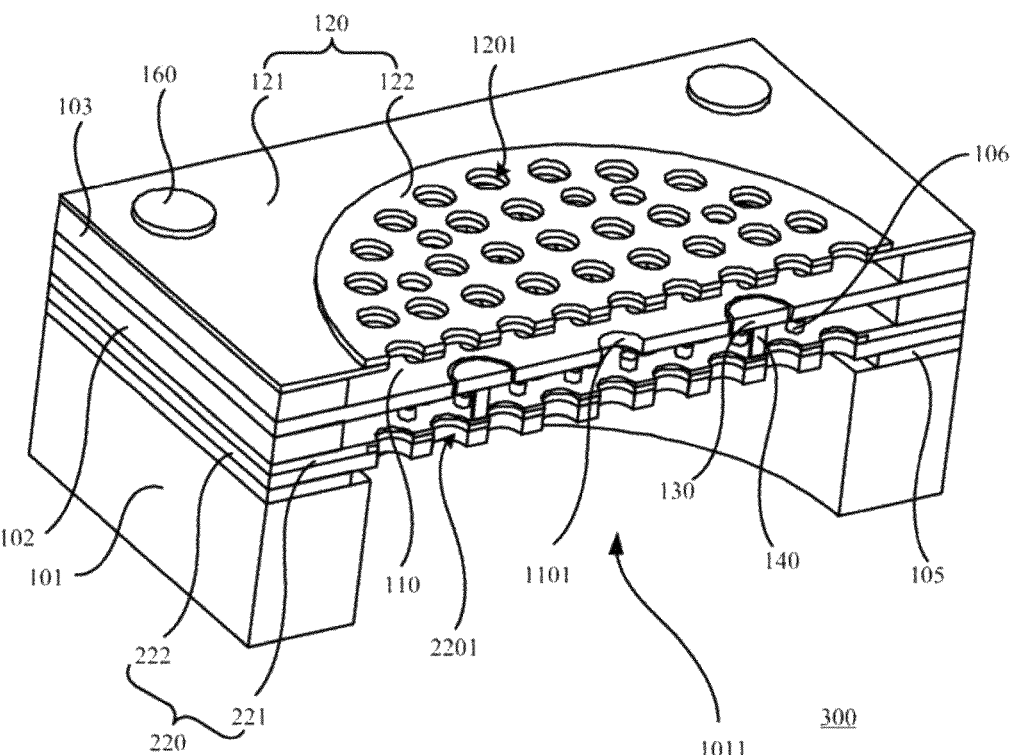
FIG. 4 is a partial stereogram of the micro-electromechanical system structure in the fourth embodiment of the present application.

FIG. 4 shows a partial stereogram of the micro-electromechanical system structure in the fourth embodiment of the present application. Compared with the micro-electromechanical system structure in the third example, the air release structure 130 of the micro-electromechanical system structure in the fourth example is connected to the second back plate 220 through a connecting pillar 140.

Refer to the FIG. 4, in this embodiment, micro-electromechanical system structure 100 comprises the first back plate 120 and the second back plate 220, the diaphragm 110 is located between the first back plate 120 and the second back plate 220. a plurality of air release channels 1101 are formed on the diaphragm 110, the air release channel 1101 comprises the second through hole located at the center of the diaphragm 110 and the first through hole located around the diaphragm 110, the second through hole is configured to rapid air release, the first through hole and the air release structure 130 located in the first through hole are configured to assisting air release. Wherein the air release structure 130 is connected to the second back plate 220 through the connecting pillar 140.

Embodiment Five

Figure 5:
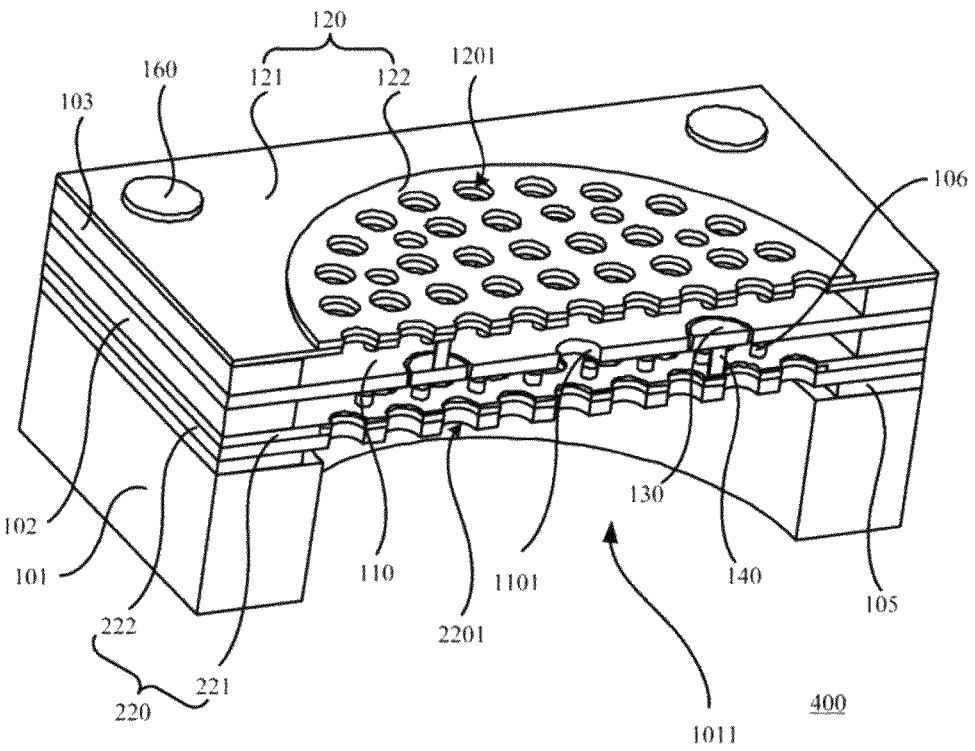
FIG. 5 is a partial stereogram of the micro-electromechanical system structure in the fifth embodiment of the present application.

FIG. 5 shows a partial stereogram of the micro-electromechanical system structure in the fifth embodiment of the present application. Compared with the micro-electromechanical system structure in the third embodiment and in the fourth embodiment, the air release structure 130 of the micro-electromechanical system structure in the fifth embodiment is connected to the first back plate 120 and/or the second back plate 220 through a connecting pillar 140.

In this embodiment, micro-electromechanical system structure 100 is located in a plurality of first through holes around the diaphragm 110, the air release structure 130 is connected to the first back plate 120 or the second back plate 220 through a connecting pillar 140. The shapes of a plurality of air release structures 130 and the shape of the connecting pillar 140 are not limited to cylinder or polygonal prisms, and technicians in the art can make other settings as needed.

Embodiment Six

Figure 6:
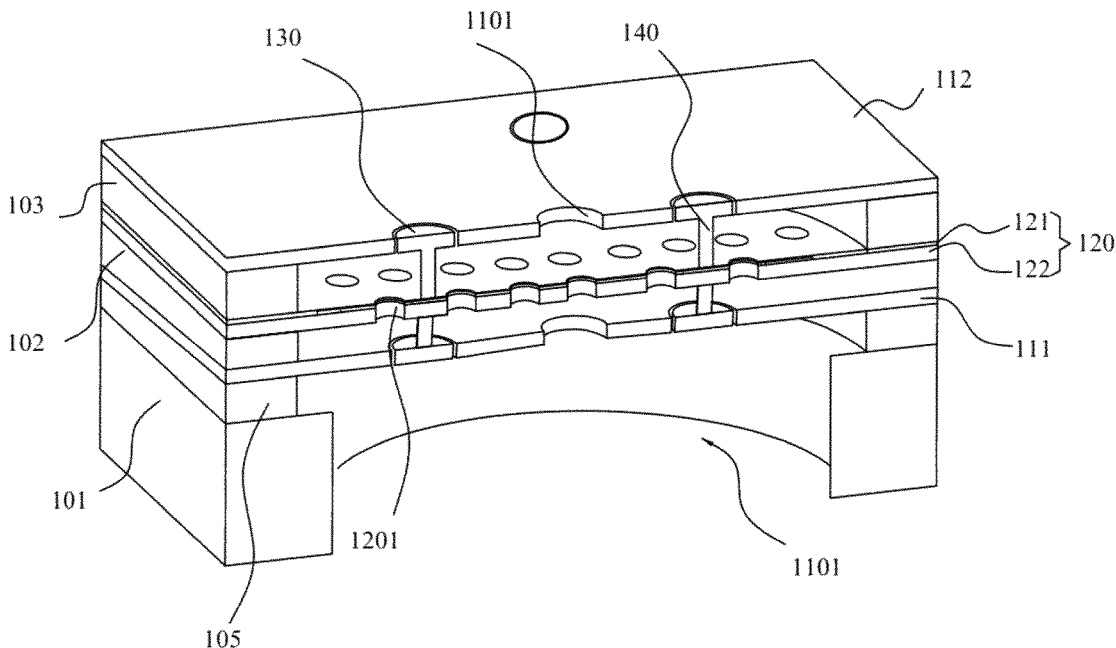
FIG. 6 is a partial stereogram of the micro-electromechanical system structure in the sixth embodiment of the present application.

FIG. 6 shows a partial stereogram of the micro-electromechanical system structure in the fifth embodiment of the present application. Compared with the micro-electromechanical system structure in the first embodiment and in the second embodiment, the micro-electromechanical system structure 100 in the sixth embodiment comprises two diaphragms 110, the two diaphragms are the first diaphragm 111 and the second diaphragm 112, wherein the third supporting structure 105 is located between the first diaphragm 111 and the substrate 101, the first supporting structure 102 is located between the first diaphragm 111 and the first back plate 120, the second supporting structure 103 is located between the first back plate 120 and the second diaphragm 112, the third supporting structure 105 is the portion left on the substrate 101 after the release of the third sacrificial layer, the third supporting structure 105 is located on the peripheral edge of the substrate 101, the first diaphragm 111 located above the third supporting structure 105 is supported on the substrate 101 in a fully fixed-peripheral manner. The first supporting structure 102 is the portion left on the first diaphragm 111 after the release of the first sacrificial layer, the first supporting structure 102 is located on the peripheral edge of the first diaphragm 111, the first back plate 120 located above the first supporting structure 102 is supported on the first diaphragm 111 in a fully fixed-peripheral manner, so that the portion of the first diaphragm 111 that is not in contact with the first supporting structure 102 is spaced at a predetermined distance from the first back plate 120. The second supporting structure 103 is the portion left on the first back plate 120 after the release of the second sacrificial layer, the position of the second supporting structure 103 corresponds to the position of the first supporting structure 102, the second supporting structure 103 is located on the peripheral edge of the first back plate 120, the second diaphragm 112 located above the second supporting structure 103 is supported on the first back plate 120 in a fully fixed-peripheral manner, so that the portion of the first back plate 120 that is not in contact with the second supporting structure 103 is spaced at a predetermined distance from the second diaphragm 112.

In this embodiment, the first back plate 120 comprises the first lower back plate 121 and the first upper back plate 122, the first lower back plate 121 is fixed on the second supporting structure 103 and connected to the connecting pillar 140, the first upper back plate 122 is located on the first lower back plate 121. Wherein the size of the first upper back plate 122 is smaller than that of the first lower back plate 121, and the first upper back plate 122 corresponds to the portion of the first back plate 120 that is not in contact with the second supporting structure 103. The material of the first lower back plate 121 is non-conductive, and for example, it can be silicon nitride, the material of the first upper back plate 122 is conductive, and for example, it can be polysilicon. The first back plate 120 comprises a plurality of first sound inlet holes 1201, each first sound inlet hole 1201 penetrates through the first lower back plate 121 and the first upper back plate 122, the first sound inlet hole 1201 is configured to allow the sound signals to reach the diaphragm 110 through the sound inlet hole 1201. However, the embodiment of the present application does not limit this, technicians in the art can make other settings on the structure and the material of the first back plate 120 as needed.

In this embodiment, the first back plate 120 is located between the first diaphragm 111 and the second diaphragm 112, a plurality of air release channels 1101 are formed in the movable area of the first diaphragm 111 and of the second diaphragm 112, wherein the air release channel 1101 comprises the second through hole and the first through hole, the second through hole is located at the center of the first diaphragm 111 and the center of the second diaphragm 112, the first through hole is located around the first diaphragm 111 and around the second diaphragm 112, the second through hole is configured to rapid air release, and the first through hole is configured to assisting air release, in addition, a first air release structure 131 is respectively arranged in the first through hole of the first diaphragm 111, and a second air release structure 132 is respectively arranged in the first through hole of the second diaphragm 112, wherein on end of the first air release structure 131 is connected to the first lower back plate 121 through the connecting pillar 140, on end of the second air release structure 132 is connected to the first upper back plate 122 through the connecting pillar 140.

Embodiment Seven

Figure 7:
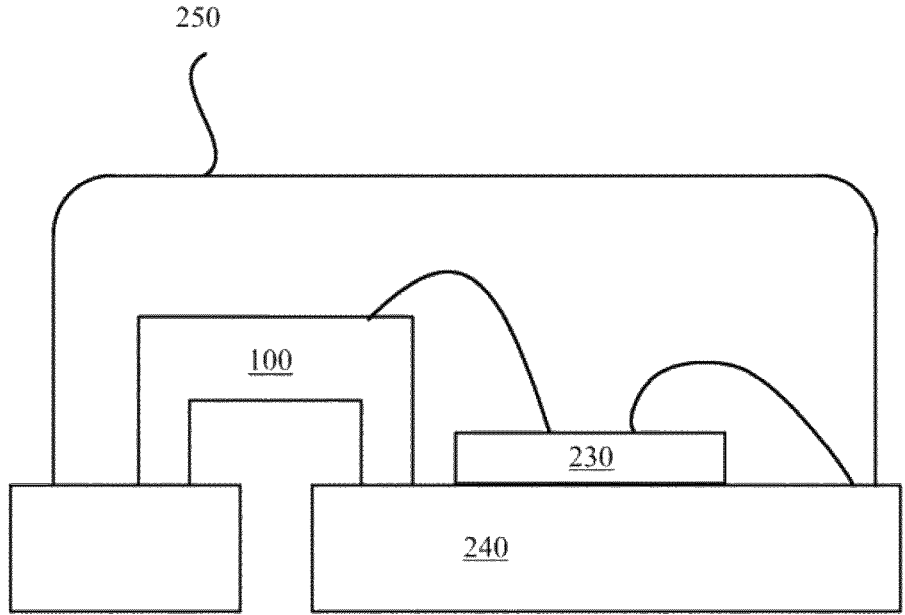
FIG. 7 is a structural diagram of a MEMS microphone of the present application.

FIG. 7 shows a structural diagram of a MEMS microphone of the present application.

As shown in FIG. 7, the MEMS microphone comprises micro-electromechanical system structure 100, chip structure 230, base plate 240, and shell 250. Wherein the base plate 240 and the shell 250 serve as the packaging structures for this device. The micro-electromechanical system structure 100 in the embodiment of this application can be selected from the four embodiments listed above, the chip structure 230, for example, can be an ASIC chip, and the base plate 240, for example, can be a lead frame or a PCB circuit board.

In this embodiment, the micro-electromechanical system structure 100 and the chip structure 230 are electrically connected through the solder pad 160, the base plate 240 and the shell 250 of the packaging structure are configured to form a storage cavity for the packaging structure, the micro-electromechanical system structure 100 and the chip structure 230 are both located in the storage cavity.

The micro-electromechanical system structure 100 in this embodiment can be any one of the micro-electromechanical system structures described in embodiment one to embodiment six, according to the micro-electromechanical system structure and the MEMS microphone comprising same provided by the embodiment of the present application, the second through hole can be formed on the diaphragm and can be used as a rapid air release channel, atmospheric pressure can quickly leak through the second through hole during ESD discharge, thereby achieving the goal of improving ESD reliability.

In a further example, the second through hole is distributed within a circular area, the center of the circular area is the center of the diaphragm, and the radius of the circular area is half the distance from the center to the edge of the diaphragm, thereby during the ESD discharge process, even if air ionization produces an explosion, the airflow mainly acts on the center area of the diaphragm through the sound inlet hole, due to the second throughhole, the airflow can quickly flow through the second through hole, this can reduce the risk of diaphragm wear, and improve the yield and reliability of the device.

In a further example, by forming the first through hole around the second through hole, and setting an air release structure separated from the diaphragm in the first through hole, a gap is formed between the air release structure and the first through hole, and the gap can be used as an auxiliary air release channel. Thereby in the case of low external sound pressure, the gas acting on the diaphragm can be discharged through these gaps for assistance, and in the case of high external sound pressure, the air release structure may undergo deformation, the deformation of the air release structure may increase the gap between the air release structure and the first through hole, and accelerate the speed of gas discharge through the gap, thus, the release capacity of the micro-electromechanical system structure may adapt to different external sound pressures, this results in ensuring both low-frequency response characteristics and sensitivity, while improving ESD reliability.

In a further example, by setting the air release structure as a cylinder or a multi-faceted prism and matching its shape with the first through hole, the gap distribution between the air release structure and the first through hole becomes more uniform. This results in a more even dispersion of gas when passing through the gap, further improving the ESD reliability.

In a further example, by setting grooves and/or air release grooves, not only does it increase the length of the air release channel, but it also reduces the rigidity of the air release structure. This makes it easier for the air release structure to deform under higher external sound pressures.

In a further example, by connecting the center of the air release structure to a connecting pillar and connecting the air release structure to the first back plate and/or the second back plate through the connecting pillar, edges of the air release structure become free ends and experience uniform forces. This configuration is advantageous for the air release structure to expand the air release channel through deformation, further improving the ESD reliability.

So the micro-electromechanical system structure and the MEMS microphone comprising same provided by the present application can release a large amount of air through the second through hole, and can further improve the gas release ability of the diaphragm and back plate under high external sound pressure by using the air release structure. Thus, it enhances the ESD reliability of the micro-electromechanical system structure and reduces costs for mass production purposes.

In the above description, there is no detailed explanation of the composition, etching and other technical details of each layer. However, technicians in the art should understand that layers, regions and so on of the desired shape can be formed through various technical means. In addition, in order to form the same structure, technicians in the art can also design methods that are not exactly the same as the methods described above. Furthermore, although each embodiment has been described separately above, this does not mean that the measures in each embodiment cannot be advantageously combined.

The above describes the embodiments of this application. However, these embodiments are only for illustrative purposes and not to limit the scope of the present application. The scope of this application is limited by the attached claims and their equivalents. Without departing from the scope of this application, technicians in the art may make various substitutions and modifications, all of which should fall within the scope of this application.

The invention claimed is:

1. A micro-electromechanical system structure, wherein the micro-electromechanical system structure comprises:
   a back plate;
   a diaphragm, the diaphragm is located on one side of the back plate, wherein the diaphragm and the back plate form a variable capacitor, the diaphragm comprises a plurality of first through holes and one or more air release structures corresponding to the first through holes;
   wherein the diaphragm further comprises one or more second through holes penetrating through the diaphragm;
   wherein the second through hole is located at a center of the diaphragm and serves as a main air release channel; the first through hole is located around the diaphragm and serves as an auxiliary air release channel, wherein a gap is existed between the air release structure and the first through hole; and the air release structure is configured to deform based on external sound pressure to expand the gap between the air release structure and the first through hole.

2. The micro-electromechanical system structure according to claim 1, wherein the micro-electromechanical system structure further comprises a plurality of connecting pillars, one end of the connecting pillar is fixedly connected to the back plate, and the other end of the connecting pillar is connected to the air release structure, wherein the air release structure is separated from the diaphragm, and the gap between the air release structure and the first through hole is configured to facilitate gas flow.

3. The micro-electromechanical system structure according to claim 2, wherein the connecting pillar comprises a supporting pillar and a side part, the side part is set around the supporting pillar, wherein the supporting pillar is set corresponding to one of the air release structures, one end of the supporting pillar is fixedly connected to the back plate, and the other end of the supporting pillar is fixedly connected to the air release structure, one end of the side part is fixedly connected to the air release structure, and the other end of the side part is fixedly connected to the back plate;
   wherein an inner surface of the side part is in contact with an outer surface of the corresponding supporting pillar.

4. The micro-electromechanical system structure according to claim 2, wherein the connecting pillar comprises a bottom part and a side part, the bottom part is fixedly connected to the back plate, the side part is set around the bottom part, and the side part is connected to the bottom part, the bottom part and the side part form a cavity.

5. The micro-electromechanical system structure according to claim 1, wherein a plurality of sound inlet holes are set on the back plate, the sound inlet hole is set corresponding to the first through hole;
   the projection of the first through hole partly overlaps with the projection of the corresponding sound inlet hole on a plane perpendicular to the thickness direction of the diaphragm.

6. The micro-electromechanical system structure according to claim 5, wherein the first through hole is shaped as a polygon, the projection of one part of a ring-shaped edge area of the polygon overlaps with the projection of the back plate on a plane perpendicular to the thickness direction of the diaphragm, the projection of the other part of the edge area overlaps with the projection of the sound inlet hole.

7. The micro-electromechanical system structure according to claim 1, wherein the shape of the air release structure comprises cylinder or prism, the shape of the air release structure matches with the shape of the first through hole.

8. The micro-electromechanical system structure according to claim 7, wherein the air release structure comprises at least one groove and/or at least one air release groove, the at least one groove extends radially inward from the cylindrical surface of the air release structure, and the at least one groove penetrates through the top surface and the bottom surface of the air release structure;
   the at least one air release groove penetrates through the top surface and the bottom surface of the air release structure.

9. The micro-electromechanical system structure according to claim 1, wherein the micro-electromechanical system structure further comprises:
   a substrate, the substrate comprises a back cavity penetrating through the substrate;
   a first supporting structure, the first supporting structure is located between the diaphragm and the substrate;
   a second supporting structure, the second supporting structure is located between the back plate and the diaphragm.

10. The micro-electromechanical system structure according to claim 1, wherein the micro-electromechanical system structure further comprises:
   a substrate, the substrate comprises a back cavity penetrating through the substrate;
   a first supporting structure, the first supporting structure is located between the back plate and the substrate;

a second supporting structure, the second supporting structure is located between the diaphragm and the back plate.

11. The micro-electromechanical system structure according to claim 1, wherein the back plate comprises a first back plate and a second back plate, the diaphragm is located between the first back plate and the second back plate.

12. The micro-electromechanical system structure according to claim 11, wherein the micro-electromechanical system structure further comprises:

a substrate, the substrate comprises a back cavity penetrating through the substrate;

a third supporting structure, the third supporting structure is located between the substrate and the second back plate;

a first supporting structure, the first supporting structure is located between the diaphragm and the second back plate;

a second supporting structure, the second supporting structure is located between the first back plate and the diaphragm.

13. The micro-electromechanical system structure according to claim 11, wherein the first back plate and the second back plate respectively comprises sound inlet holes.

14. The micro-electromechanical system structure according to claim 1, wherein the diaphragm comprises a first diaphragm and a second diaphragm, the back plate is located between the first diaphragm and the second diaphragm.

15. The micro-electromechanical system structure according to claim 14, wherein the micro-electromechanical system structure further comprises:

a substrate, the substrate comprises a back cavity penetrating through the substrate;

a third supporting structure, the third supporting structure is located between the substrate and the first diaphragm;

a first supporting structure, the first supporting structure is located between the first diaphragm and the back plate;

a second supporting structure, the second supporting structure is located between the back plate and the second diaphragm.

16. The micro-electromechanical system structure according to claim 1, wherein the second through hole is distributed within a circular area, the center of the circular area is the center of the diaphragm, and the radius of the circular area is half the distance from the center to the edge of the diaphragm.

17. The micro-electromechanical system structure according to claim 1, wherein the shape of the first through hole and the shape of the second through hole are both circle or polygon.

18. The micro-electromechanical system structure according to claim 17, wherein the first through hole is located in the surrounding area of the diaphragm.

19. A MEMS microphone, wherein the MEMS microphone comprises a micro-electromechanical system structure, comprising:

a back plate;

a diaphragm, the diaphragm is located on one side of the back plate, wherein the diaphragm and the back plate form a variable capacitor, the diaphragm comprises a plurality of first through holes and one or more air release structures corresponding to the first through holes;

wherein the diaphragm further comprises one or more second through holes penetrating through the diaphragm;

wherein the second through hole is located at a center of the diaphragm and serves as a main air release channel; the first through hole is located around the diaphragm and serves as an auxiliary air release channel, wherein a gap is existed between the air release structure and the first through hole; and the air release structure is configured to deform based on external sound pressure to expand the gap between the air release structure and the first through hole.

* * * * *